United States Patent
Crozier et al.

(10) Patent No.: US 7,898,252 B2
(45) Date of Patent: Mar. 1, 2011

(54) PHASED ARRAY COIL FOR MRI

(75) Inventors: Stuart Crozier, Queensland (AU); Feng Liu, Queensland (AU); Bing Keong Li, Queensland (AU)

(73) Assignee: University of Queensland, Queensland (AU)

( * ) Notice: Subject to any disclaimer, the term of this patent is extended or adjusted under 35 U.S.C. 154(b) by 0 days.

(21) Appl. No.: 11/908,033

(22) PCT Filed: Mar. 9, 2006

(86) PCT No.: PCT/AU2006/000311
§ 371 (c)(1),
(2), (4) Date: Mar. 31, 2008

(87) PCT Pub. No.: WO2006/094354
PCT Pub. Date: Sep. 14, 2006

(65) Prior Publication Data
US 2008/0272785 A1    Nov. 6, 2008

(30) Foreign Application Priority Data
Mar. 10, 2005   (AU) ................................ 2005901158

(51) Int. Cl.
*G01V 3/00* (2006.01)
(52) U.S. Cl. ......................................... 324/307; 324/309
(58) Field of Classification Search .......... 324/300–322; 600/410–435
See application file for complete search history.

(56) References Cited

U.S. PATENT DOCUMENTS

| | | | | |
|---|---|---|---|---|
| 3,937,955 A * | 2/1976 | Comisarow et al. | ........... | 250/283 |
| 4,682,112 A * | 7/1987 | Beer | .............................. | 324/322 |
| 5,086,275 A * | 2/1992 | Roemer | ........................ | 324/309 |
| 5,179,332 A * | 1/1993 | Kang | .............................. | 324/313 |
| 5,510,711 A * | 4/1996 | Molyneaux et al. | ........... | 324/309 |
| 5,719,499 A * | 2/1998 | Chandrakumar | .............. | 324/322 |
| 5,861,749 A * | 1/1999 | Van Heelsbergen | .......... | 324/322 |
| 5,903,150 A * | 5/1999 | Roznitsky | ....................... | 324/318 |
| 6,236,205 B1 * | 5/2001 | Ludeke et al. | ................. | 324/318 |
| 6,348,791 B2 * | 2/2002 | Shattil | ............................ | 324/225 |
| 6,411,090 B1 * | 6/2002 | Boskamp | ....................... | 324/318 |
| 6,486,667 B1 * | 11/2002 | Wu et al. | ......................... | 324/306 |
| 6,608,480 B1 * | 8/2003 | Weyers | ........................... | 324/318 |
| 6,727,703 B2 * | 4/2004 | Lee | ................................. | 324/322 |
| 6,771,067 B2 * | 8/2004 | Kellman et al. | ................ | 324/307 |
| 6,825,660 B2 * | 11/2004 | Boskamp | ....................... | 324/318 |
| 6,906,518 B2 * | 6/2005 | Leussler | ......................... | 324/318 |
| 6,952,100 B1 * | 10/2005 | McKinnon et al. | ............ | 324/318 |
| 6,995,561 B2 * | 2/2006 | Boskamp et al. | .............. | 324/318 |
| 7,012,430 B2 * | 3/2006 | Misic | .............................. | 324/318 |
| 7,064,546 B2 * | 6/2006 | Feiweier | ........................ | 324/307 |
| 7,075,299 B1 * | 7/2006 | Peters | ............................. | 324/309 |

(Continued)

FOREIGN PATENT DOCUMENTS

GB              2227095 A          7/1990

(Continued)

*Primary Examiner* — Melissa J Koval
*Assistant Examiner* — Dixomara Vargas
(74) *Attorney, Agent, or Firm* — Hunton & Williams LLP

(57) ABSTRACT

A method and apparatus for ameliorating high-field image distortion in magnetic resonance imaging of tissue. Two separate scans of a target region are taken with different phase and amplitude values for each scan. The phase and amplitude values of each scan are selected to be complimentary so as to provide scans that have improved SNR when averaged using, for example, sum-of-squares averaging.

23 Claims, 7 Drawing Sheets

U.S. PATENT DOCUMENTS

| | | | |
|---|---|---|---|
| 7,091,721 B2 * | 8/2006 | Jevtic | 324/318 |
| 7,123,010 B2 * | 10/2006 | Krockel | 324/318 |
| 7,176,688 B2 * | 2/2007 | Sato | 324/318 |
| 7,245,752 B2 * | 7/2007 | Oesingmann | 382/128 |
| 7,253,622 B2 * | 8/2007 | Saylor et al. | 324/318 |
| 7,336,074 B2 * | 2/2008 | Yang et al. | 324/318 |
| 7,446,528 B2 * | 11/2008 | Doddrell et al. | 324/318 |
| 2003/0214299 A1 * | 11/2003 | Lee et al. | 324/318 |
| 2006/0261811 A1 * | 11/2006 | Ham et al. | 324/318 |

FOREIGN PATENT DOCUMENTS

| | | |
|---|---|---|
| GB | 2337819 A | 12/1999 |
| WO | WO 97/09632 A1 | 3/1997 |
| WO | WO 2005/111645 A2 | 11/2005 |

* cited by examiner

 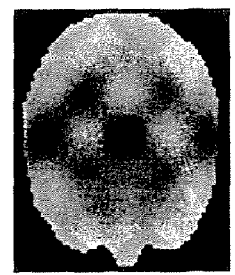 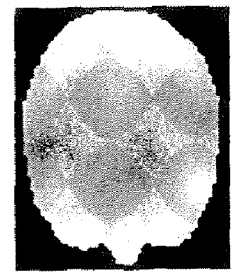
Fig 5(a)　　　　　Fig 5(b)　　　　　Fig 5(c)
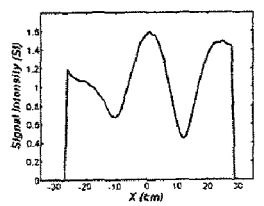 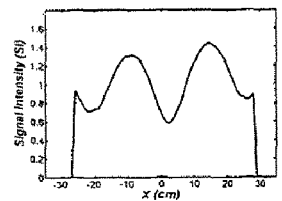 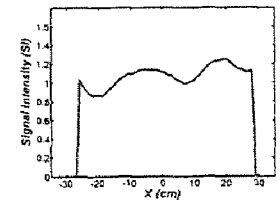
Fig 6(a)　　　　　Fig 6(b)　　　　　Fig 6(c)
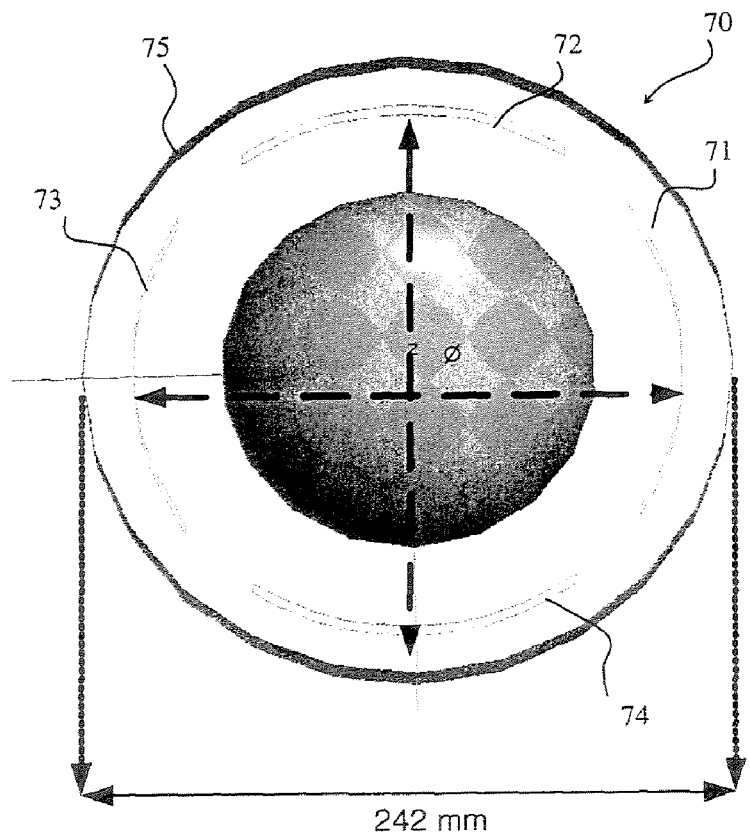
FIG 7

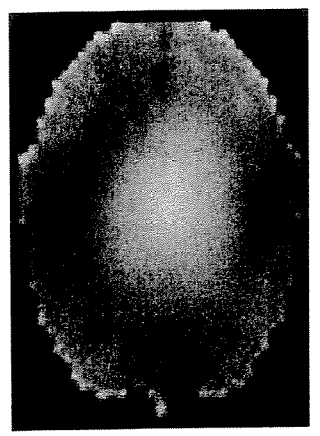 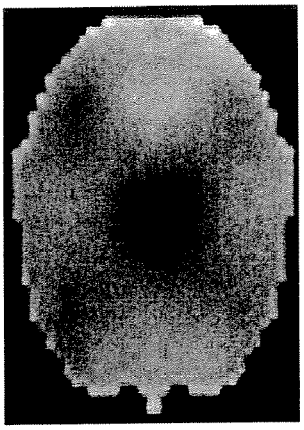 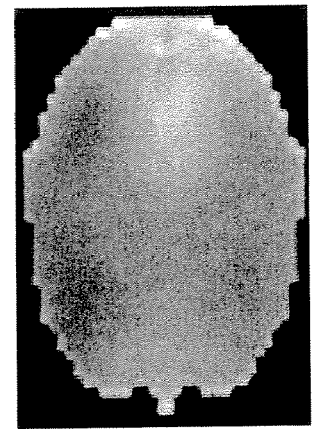
FIG 8(a)　　　　　FIG 8(b)　　　　　FIG 8(c)
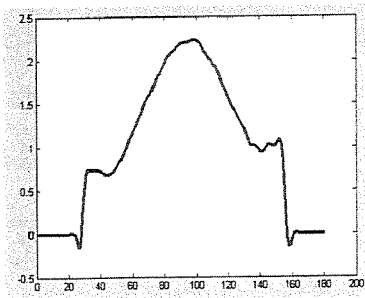 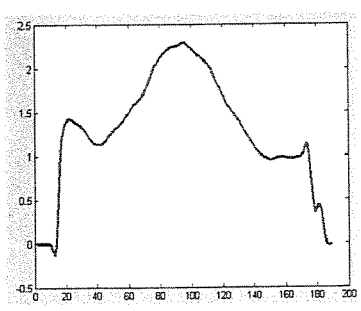
FIG 9(a)　　　　　　　　　FIG 10(a)
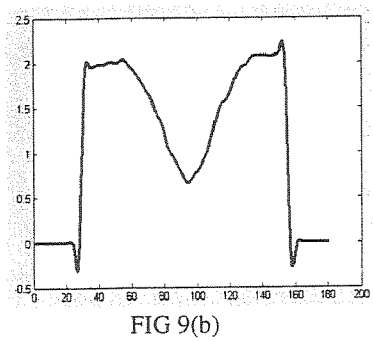 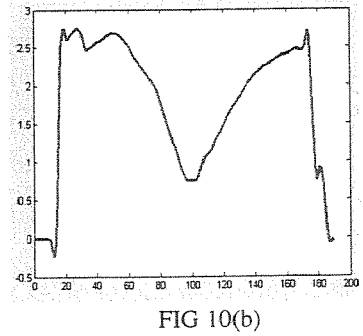
FIG 9(b)　　　　　　　　　FIG 10(b)
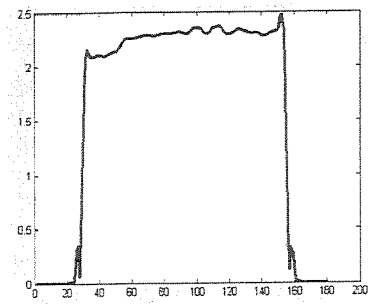 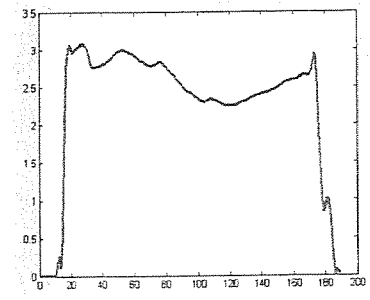
FIG 9(c)　　　　　　　　　FIG 10(c)

PHASED ARRAY COIL FOR MRI

This invention relates to magnetic resonance imaging (MRI). In particular, it relates to control of amplitude and phase of radio frequency coil arrays to achieve enhanced imaging.

BACKGROUND TO THE INVENTION

MRI is moving inexorably toward higher field strength in search of improved signal-to-noise ratio and spectral resolution. At high fields (>4 Tesla) the precession frequency is higher and therefore the wavelength shorter. The tissue/field interactions become quite pronounced at high field and make obtaining high quality images very difficult. Beck has shown [Beck et al, MRM 51 Pg 1103-1107 2004] that at 11 T image intensity distributions are subject to significant distortions attributable to tissue/field interactions. Several methods such as optimizing the current distribution on the rungs of a multi-element volume coil [Ledden, Proc ISMRM 11 pg 2390 2003], transmitting field of time varying spatial characteristics using two separate pulses [Ledden & Cheng, Proc ISMRM 12 pg 38 2004] and the use of parallel imaging at high field strength [Weisinger et al, Proc ISMRM 12 Pg 323 2004] have been suggested to reduce the distortions.

A wide variety of parallel imaging techniques are available, such as the well known simultaneous acquisition of spatial harmonics (SMASH) [Sodikson & Manning, Magn Reson Med 38 pg 591-603, 1997] and sensitivity encoding (SENSE) [Pruessman et al, Magn Reson Med 42 pg 952-962, 1999]. Rapid parallel imaging is enabled by phased array coils as they allow scan time reduction compared to single coil acquisitions. The known techniques have typically used receive-only phased arrays but transceiver phased arrays are becoming more common.

Array technology was introduced by Roemer, as described in U.S. Pat. No. 4,825,162 assigned to General Electric Company. Roemer describes how images from an array of coils can be combined on a point-by-point basis to produce a single composite image. Roemer also describes how to minimise interactions between adjacent coils.

A significant amount of research directed to improving the usefulness on MRI has focussed on improving the signal to noise ratio (SNR). Larson described a focussing process in U.S. Pat. No. 5,252,922 that used a phased array of antennas to focus in a specific region of a body being imaged. Larson claims to have achieved focussing in volumes as small as 500-3000 $cm^3$.

The SNR can be improved by applying higher fields but this can result in high Specific Absorption Rate (SAR), which may exceed regulatory guidelines. Peterson et al [Invest Rad 38 (7) pg 428-435 2003] has described a transceiver phased array for imaging the spinal cord at 3 Tesla. The Peterson system produced high resolution images. In a related paper [Invest Rad 38 (7) pg 443-451 2003], Peterson describes another transceiver phased array coil for imaging the pelvic region. Once again the phased array coils produced high resolution images.

Various array designs have been conceived for imaging various regions of the body. Persons skilled in the field will be familiar with common circular and rectangular array elements. Planar strip arrays are also known, such as described by Lee in United States patent application number 2003/0214299. Lee includes a useful background to MRI which is incorporated herein by reference. Lee also usefully notes that the current amplitude and phase of each transmit array element can be individually regulated such that the homogeneity of the RF excitation field is optimised in the presence of the patient.

Finally, reference may be had to International patent application number WO 2004/021025 filed by the present applicant. This patent application describes a coil array in which each coil element has its maximum sensitivity close to the centre of the object under study. The described coil array is useful for deep imaging of a body, for example cardiac imaging.

OBJECT OF THE INVENTION

It is an object of the present invention to provide an improved method and apparatus for magnetic resonance imaging.

Further objects will be evident from the following description.

DISCLOSURE OF THE INVENTION

In one form, although it need not be the only or indeed the broadest form, the invention resides in a coil system for use with magnetic resonance imaging to form images of a region of interest, the coil system comprising:
a phased array having at least two coils;
means for driving each coil of said phased array at an amplitude and phase determined to focus at a target region; and
an interface subsystem linking said phased array to a magnetic resonance imaging system,
said magnetic resonance imaging system transmitting a substantially uniform magnetic field through said phased array to said region of interest and receiving a response to said substantially uniform magnetic field from said region of interest.

Preferably the phased array is a transceiver array which both transmits the field and receives the response.

In a further form the invention resides in a method of recording a magnetic resonance image of a target region including the steps of:
transmitting a substantially uniform magnetic field into said target region by driving a phased array having at least two coils at selected phase and amplitude values;
recording signals received from said target region in response to the substantially uniform magnetic field; and
processing said signals to construct an image.

In one alternate form the method may further include the steps of:
driving the phased array with a first set of phase and amplitude values and recording a first image;
driving the phased array with a second set of phase and amplitude values and recording a second image; and
constructing an improved image from said first image and said second image.

Suitably the step of constructing an improved image employs a process of averaging said first image and said second image. A suitable averaging process is point by point sum-of-squares averaging.

In a second alternate form the method may further include the steps of:
driving the phased array with a first set of phase and amplitude values and recording first time-domain signals;
driving the phased array with a second set of phase and amplitude values and recording second time-domain signals;
combining the first time-domain signals and the second time-domain signals; and performing a multi-dimensional Fourier transform to construct the image.

BRIEF DETAILS OF THE DRAWINGS

To assist in understanding the invention preferred embodiments will now be described with reference to the following figures in which:

FIG. 5 show SI maps constructed from the model of FIG. 1 and FIG. 4;

FIG. 6 shows plots of a slice of the images of FIG. 5

FIG. 7 is a schematic of a second embodiment similar to the first embodiment of FIG. 1;

FIG. 8 show SI maps constructed from the model of FIG. 7;

FIG. 9 is a plot of a lateral slice of the SI map of FIG. 8;

FIG. 10 is a plot of a coronal slice of the SI map of FIG. 8;

DETAILED DESCRIPTION OF THE DRAWINGS

Figure 1:
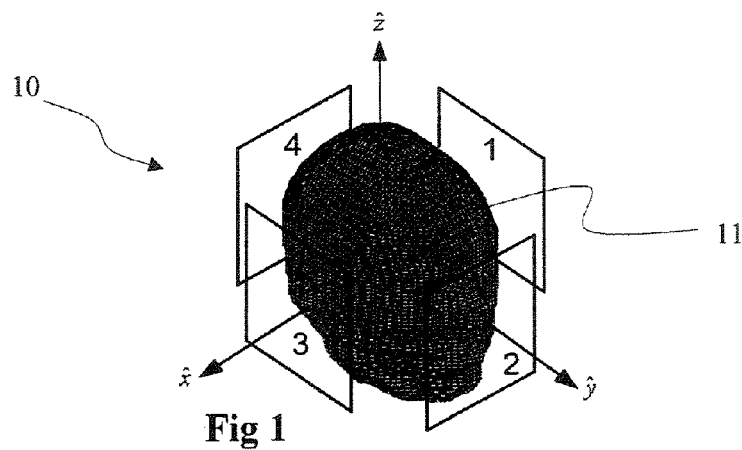
FIG. 1 is a schematic of a head model and four-coil phased array.

In describing different embodiments of the present invention common reference numerals are used to describe like features.

Referring to FIG. 1, there is shown a phased array coil system 10 consisting of four coils (labeled 1-4) arranged around a head 11. Brain imaging at 11 T (470 Mhz) can produce problematic signal voids due to tissue/field interactions. To minimize the problem each coil is driven with a signal of selected amplitude (voltage) and phase to produce a substantially homogeneous field in a region of interest which can be away from the geometric centre of the coil system 10.

Figure 2:
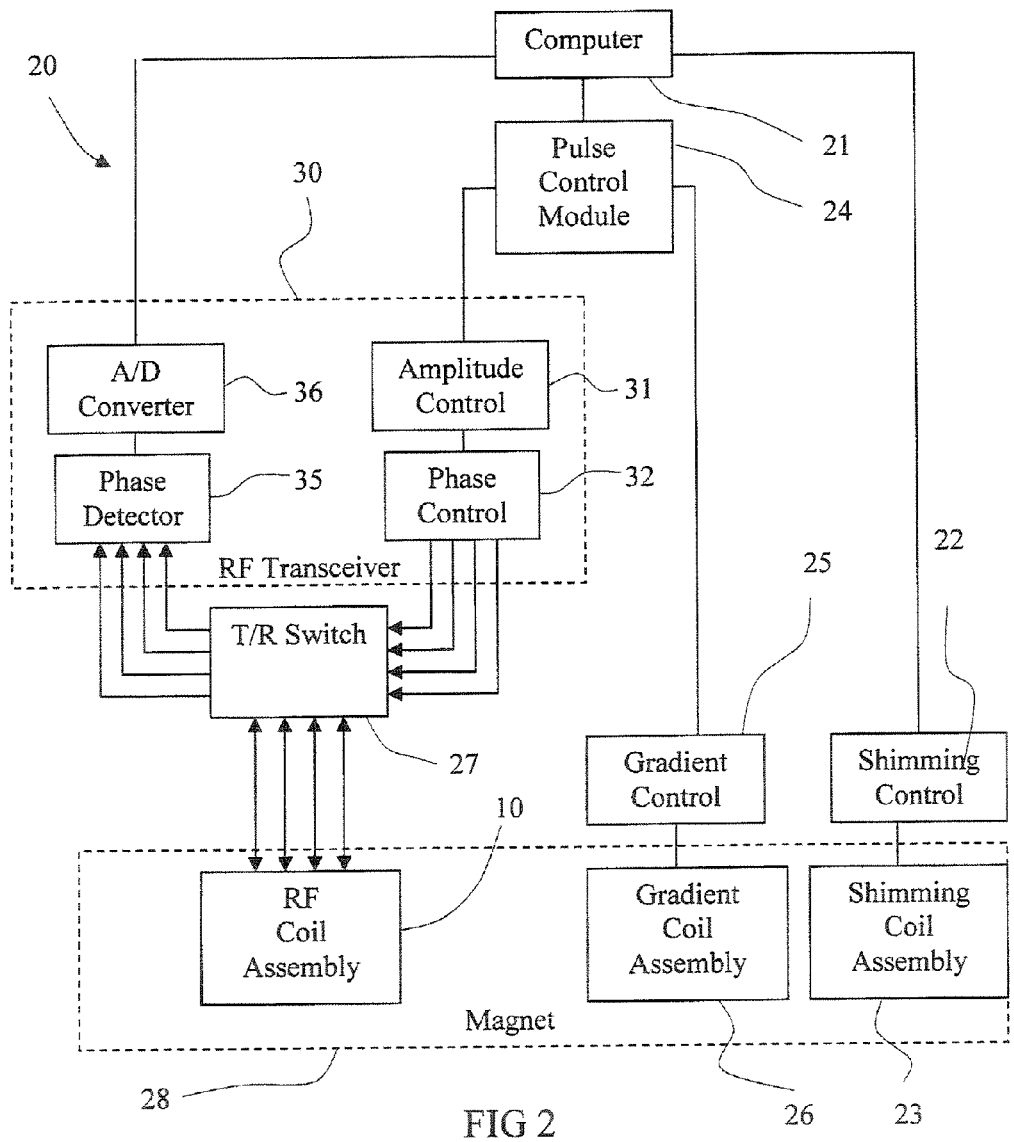
FIG. 2 is a block diagram of an exemplary MRI.

A schematic block diagram of an MRI system for use with the invention is shown in FIG. 2. The MRI system 20 includes a computer 21 which provides overall control of the system. In particular, it provides signal to the shimming controller 22 which drives the shimming coil assembly 23. A pulse control module 24 is in communication with the computer 21 and provides signals to a gradient control module 25 to drive the gradient coil assembly 26. The pulse control module 24 and the gradient control module 25 together provide the gradient waveforms Gx, Gy and Gz for various pulse sequence strategies.

The pulse control module 24 also controls a RF Transceiver assembly 30 that provides signals of determined phase and amplitude to a transmit/receive switch 27 which directs the signals to the coils of the coil system 10.

The shimming coil assembly 23, gradient coil assembly 26 and coil system 10 operate in the $B_0$ field of magnet 28, as will be well understood to persons skilled in the field.

Figure 3:
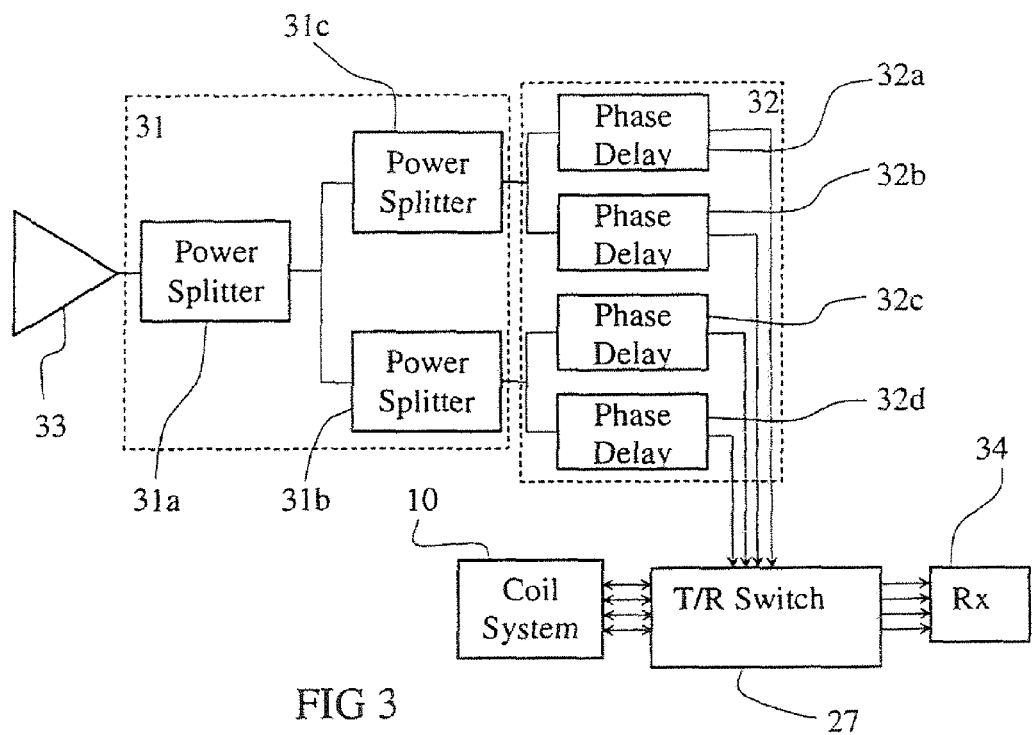
FIG. 3 is an expanded block diagram of an RF transceiver.

The RF transceiver assembly 30 consists of amplitude control 31 and phase control 32 for each signal provided to the coil system 10. One embodiment for amplitude and phase control is shown in FIG. 3. The signal from the pulse control module 24 is amplified by power amplifier 33 which is then split by a first unequal power splitter 31a. The two signals are each spilt further by another two unequal power splitters 31b, 31c. At this stage there are four signals of different amplitude. Phase control 32 applies different phase delays to each signal using four phase delay elements 32a-d.

The signals received by the coil system 10 are switched by the T/R switch 27 to a receiver 34 which has quadrature phase detector 35 and A/D converter 36. The T/R switch 27 may be radiofrequency circulators or circulator hybrids, or a group of individual T/R switches. The signals are passed to computer 21 to reconstruct an image of the region of interest.

Separate adjustment of phase and amplitude for each coil facilitates correction of the transmission field to account for tissue/field interactions. To exemplify the effectiveness of the technique, the $B_1$ fields inside a simulated brain are calculated and used to construct signal intensity (SI) maps.

In the simulation of the invention there are four focusing transceive phased array coils and two separate scans of the same slice (Scan_A and Scan_B) with each scan using different excitations during transmission. That is, parallel, transmission phase cycling. Thereafter, the received $B_1$ fields from the two separate scans are used for calculating the signal intensity (SI) maps, which are combined together in the image domain. By optimizing the phases of the transmission systems, signal distortion is significantly reduced.

Figure 4:
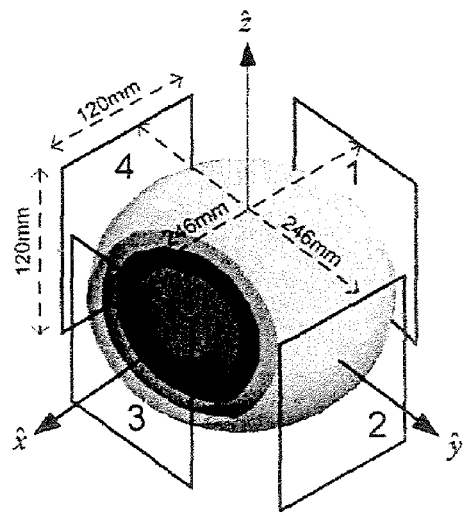
FIG. 4 is a schematic similar to FIG. 1, depicting detail of a head phantom.

A hybrid Finite Difference Time Domain (FDTD)/Method of Moments (MOM) approach is adopted in this work to accurately calculate $B_1$ fields inside the brain. Firstly, four square surface coils resonating at 470 MHz, loaded with a four layered spherical phantom with each layer having different dielectric constants and conductivities that approximately resemble a human head is simulated using FEKO, a MOM based RF simulation program to calculate the current distribution on each coil (available from EM Software & Systems-SA (Pty) Ltd of Technopark, Stellenbosch, South Africa; www.feko.co.za). With the coils loaded with the spherical phantom, coil-sample coupling is considered. The dimension of each coil is 120×120 mm, positioned orthogonally and separated from its opposite coil neighbor with a distance of 246 mm as depicted in FIG. 4. At this distance, minimum mutual coupling existed between coils. Tabulated in Table 1 are the various excitations on each coil for Scan_A and Scan_B during MOM simulation. Once the current density distribution on each coil is calculated for Scan_A and Scan_B, an in-house FDTD package [Liu et al, Concepts Magn Reson 15(1) pg 26-36 2002] is employed to evaluate the EMF fields in the human head. A voxel-based human head is used during FDTD simulation as shown in FIG. 1 to accurately predict the transmit $B_1$ field in the human head, the reciprocity theorem is used to calculate received $B_1$ fields, from which signal intensity (SI) maps are simulated.

TABLE 1

|  | Scan_A | | Scan_B | |
| --- | --- | --- | --- | --- |
|  | Amplitude (V) | Phase | Amplitude (V) | Phase |
| Coil 1 | 5 | 45° | 5 | 180° |
| Coil 2 | 5 | 135° | 5 | 10° |
| Coil 3 | 5 | 225° | 5 | 0° |
| Coil 4 | 5 | 315° | 5 | 190° |

FIG. 5(a-b) shows the SI maps calculated for Scan_A and Scan_B while 5(c) shows the SI map when Scan_A and Scan_B are combined together using sum-of-squares. FIG. 6(a-c) shows a corresponding plot of SI taken from the mid section of the head along the lateral direction Using the set of excitations for Scan_A, which is a quadrature drive scheme, signal voids are apparent and obvious as shown in FIG. 5(a). Bright spots marked by high SI and dark rings which appear as low SI can be clearly seen in FIG. 6(a). However by performing field focusing through changing the phases as for the set of excitations used in Scan_B a different form of signal voids results as is shown in FIG. 5(b) and FIG. 6(b). The phases in Scan B are optimized to generate the reverse distortion pattern generated by those in Scan A. Therefore, through pixel by pixel combining SI maps of FIG. 5(a) and FIG. 5(b) using a sum-of-squares method, a relatively uniform SI map is attained as is shown in FIGS. 5(c) and 6(c).

Although a sum-of-squares averaging approach is described an improved image may also be constructed by first combining the time domain signals acquired in multiple scans and then performing multi-dimensional Fourier transforms to construct the image.

Two observations are evident from the simulation. Firstly, control of the phase and amplitudes of each coil in the coil system 10 is used to control the homogeneity of the transmitted field. This means that the position of a substantially homogeneous region is not limited to the geometric centre of the coil system. Secondly, phase amplitudes of successive scans may be controlled to provide complimentary fields that can be averaged to ameliorate unwanted tissue/field effects.

It will be appreciated that the embodiment described above utilizes four transceive phased array coils but the invention is not limited to such an arrangement. All that is required is that there are two or more coils. However, the inventors envisage that the invention is most advantageous when the coil system surrounds the region of interest.

It will further be appreciated that the invention is not limited to transceive coils. The description is applied to transceive coils for convenience. Separate systems can be used for transmit and receive functions.

As discussed above in the background section, previous uses of phased arrays have not controlled the phase and amplitude applied to each coil to achieve local focusing in a sample. It is evident from FIG. 5 that phase and amplitude values can be controlled to achieve local focusing and that the best values are determined by the tissue/field interactions. These interactions are complex and difficult to predict. The inventors envisage that a degree of adjustment 'on-the-fly' will be beneficial for maximum SNR and minimum SAR. Phase and amplitude adjustment can be performed by a skilled MRI operator via input to the computer 21. It is further envisaged that a database of most appropriate settings will be compiled over time so that in many cases good images can be obtained with settings extracted from a database based on body region, size and age of patient, field strength, and other parameters.

A further embodiment of the invention is shown in FIG. 7. FIG. 7 shows a head coil system 70 similar to the head coil system 10 described above. In the embodiment of FIG. 7 the coils 71-74 are curved and located within shielding 75. A multi-layer spherical phantom 76 and the shielding 75 are included during tuning of coils 71-74 to resonate at 470 MHz. Tabulated in Table 2 are the excitations used on each coil for Scan_C and Scan_D. The SI maps for Scan_C, Scan_D and the combined image using sum-of-squares are shown in FIG. 8.

It will be noted from Table 2 that both the amplitude and phase values are changed between Scan_C and Scan_D. It is evident that the regions of homogeneity are different between Scan_C and Scan_D, and that the combined image is essentially homogeneous over the entire brain region. This is evident in the plots of FIG. 9 and FIG. 10, which show very even signal intensity along the lateral direction (FIG. 9(c)) and the coronal direction (FIG. 10(c)).

TABLE 2

|  | Scan_C | | Scan_D | |
|  | Amplitude (V) | Phase | Amplitude (V) | Phase |
| --- | --- | --- | --- | --- |
| Coil 1 | 3 | 25° | 8 | 0° |
| Coil 2 | 3 | 295° | 8 | 180° |
| Coil 3 | 3 | 25° | 8 | 180° |
| Coil 4 | 3 | 295° | 8 | 10° |

As the invention requires two scans of the same slice, it is advantageous to employ a rapid parallel imaging technique to minimize motion artifacts. A suitable reconstruction algorithm is GRAPPA [Griswold M A, Jakob P M, Hiedemann R M, Nittka M, Jellus V, Wang J M, et al. 2002. Generalized autocalibrating partially parallel acquisitions (GRAPPA). Magn Reson Med 47:1202-1210]. In GRAPPA, a small number of extra lines are acquired during the acquisition of the undersampled data. These extra lines are known as autocalibration signal (ACS) lines and are used to reconstruct missing k-space lines of each coil. To determine the weights used for reconstruction GRAPPA uses multiple blocks from all coils to fit to the ACS lines from that coil.

Figure 11:
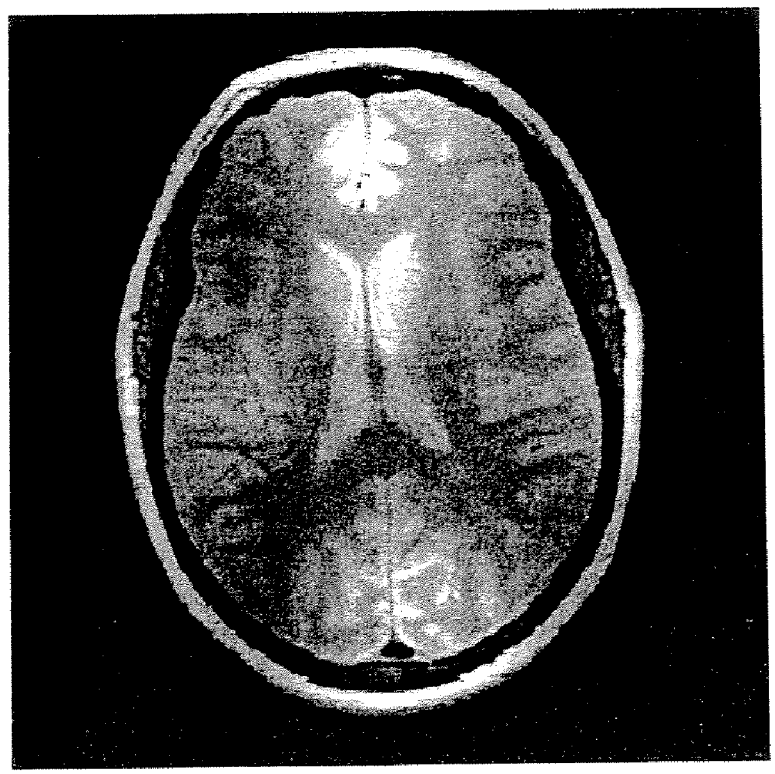
FIG. 11 is an SI map of a brain image using a similar model to FIG. 7 and incorporating GRAPPA reconstruction.

To implement GRAPPA reconstruction, a reduction factor of 2 and a total number of 21 ACS lines are used to implement the reconstruction procedure. Every even line of the synthetically derived k-space data is unsampled, and the 21 ACS lines are acquired at the center of the k-space. The missing lines in each k-space set are reconstructed and the fully reconstructed k-space data is Fourier transformed to produce two individual brain scans which are processed in a similar method to that described above. A brain image using the described method and incorporating GRAPPA is shown in FIG. 11.

Figure 12:
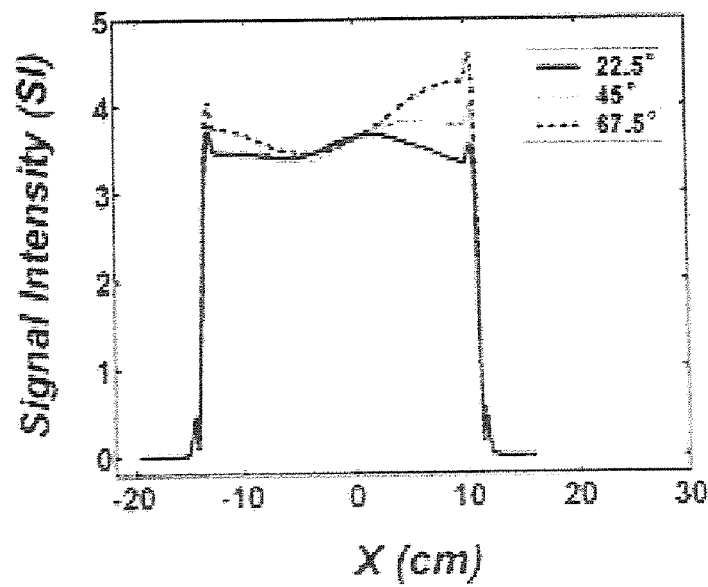
FIG. 12 is a plot demonstrating sensitivity to coil position.

Another factor which can impact the quality of image obtained with the invention is the placement of the coils. When the coils are positioned at different locations, the B1 field pattern will also change. Therefore, if the coils are arranged in optimum location further improvement of the B1 field can be achieved. This is demonstrated by the plot of FIG. 12 which shows SI plots taken along the lateral sides of the head model (same location as the plots of FIG. 6 and FIG. 8) but with the coils rotated 22.5 degrees, 45 degrees and 67.5 degrees relative to the arrangement shown in FIG. 7. As can be seen form FIG. 12 the position of the coils can be optimized.

Figure 13:
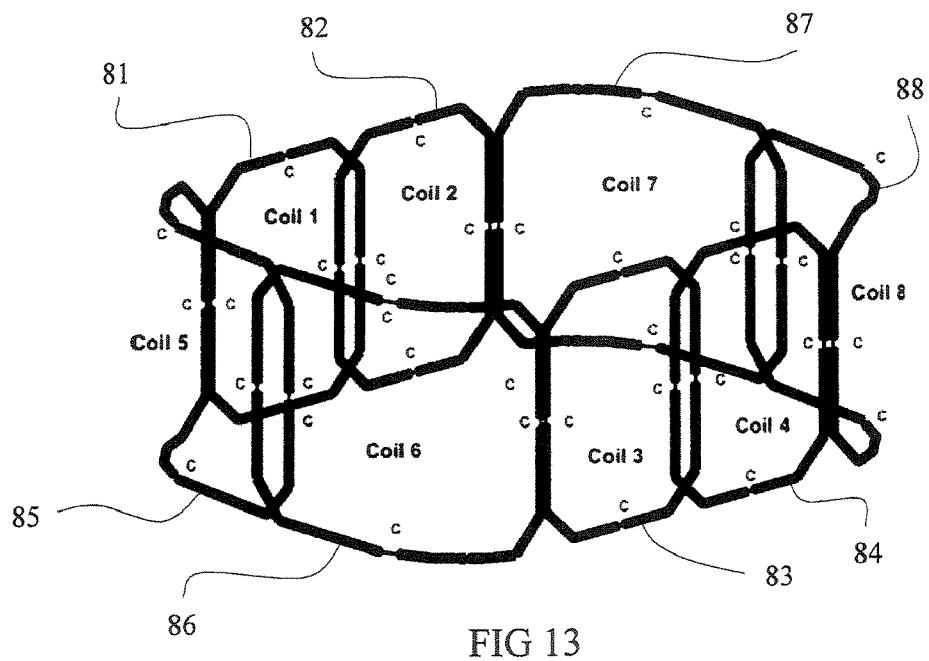
FIG. 13 is a schematic of an eight-coil phased array for a torso.

The previous three embodiments have related to imaging of the brain. The invention also has application to other parts of the body. Shown in FIG. 13 is an eight element transceive phased array torso coil. In order to demonstrate the efficacy of the invention the coil is modeled in similar manner to that described above for the first embodiment.

The eight element phased array torso coil is first modeled using the FEKO software. The overall dimensions are 392 mm×312 mm×160 mm and the coil shape is designed to fit onto a voxel-based human torso model with frequency-dependent dielectric properties obtained from the United States Air Force (http://www.brooks.af.mil/AFRL/HED/hedr/).

The coil elements are typically positioned about 15 mm from the model. Distributed capacitors are placed at equal intervals in each single coil element to reduce frequency shifts associated with dielectric loading. Using conventional circuitry, the torso phased array coil is tuned to 85 MHz and matched to 50 Ohms when loaded with the body model. The individual coil dimensions are 160 mm×120 mm for coils 81-84 and 160 mm×168 mm for coils 85-88. FEKO automatically includes coil-coil and coil-sample coupling in its calculations, a combination of coil overlapping and the insertion of decoupling capacitors between coils, where they are not overlapped, are used to minimize the extrinsic coupling, as is common in reception-only systems.

An FDTD/MOM technique is used as described above. The outputs of the FDTD calculations are the magnitudes and phases of the sinusoidal steady-state electric and magnetic fields, which are registered within a period of the operating frequency. After the FDTD calculation transient response has passed, the peak EMF data are recorded. The elapsed (transient) time is also recorded to calculate the phases of the steady EMF. In this way, the complex electric and magnetic field vectors on the grid of FDTD cells can be generated. The SI are calculated and displayed.

Figure 14:
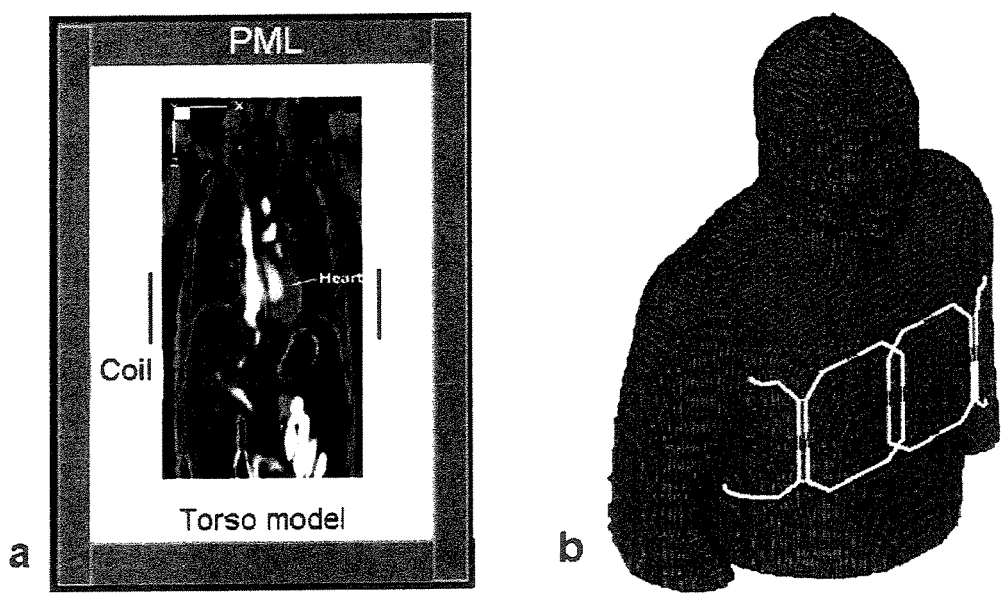
FIG. 14 shows a torso model and the position of the eight-coil array.

To implement the FDTD calculation, the cell size is 4 mm and the entire computational domain is divided into $N_x \times N_y \times N_z = 114 \times 90 \times 80\ 820.8 \times 10^3$ Yee cells. Ten PML layers with a parabolic conductivity profile are located on the six open sides, which are positioned at the anterior, posterior, the two lateral sides, the top and bottom planes with respect to the torso model. The overall structure is shown in FIG. 14$a$ and the torso phased array is shown in FIG. 14$b$.

The benefit of controlling phase and amplitude on each coil are exemplified by applying the three drive schemes tabulated in Table 3.

TABLE 3

|  | Non focussed (Identical Drive Scheme) | | Focussed (Focussed Drive Scheme) | | Circular phased (Circular Drive Scheme) | |
| --- | --- | --- | --- | --- | --- | --- |
|  | Amplitude (V) | Phase | Amplitude (V) | Phase | Amplitude (V) | Phase |
| Coil 1 | 10 | 90° | 12 | 45° | 10 | 0° |
| Coil 2 | 10 | 90° | 12 | 45° | 10 | 0° |
| Coil 3 | 10 | 90° | 11.69 | 90° | 10 | 180° |
| Coil 4 | 10 | 90° | 11.69 | 90° | 10 | 180° |
| Coil 5 | 10 | 90° | 12 | 180° | 10 | 90° |
| Coil 6 | 10 | 90° | 13.57 | 0° | 10 | 90° |
| Coil 7 | 10 | 90° | 12 | 180° | 10 | 270° |
| Coil 8 | 10 | 90° | 13.57 | 0° | 10 | 270° |

Figure 15:
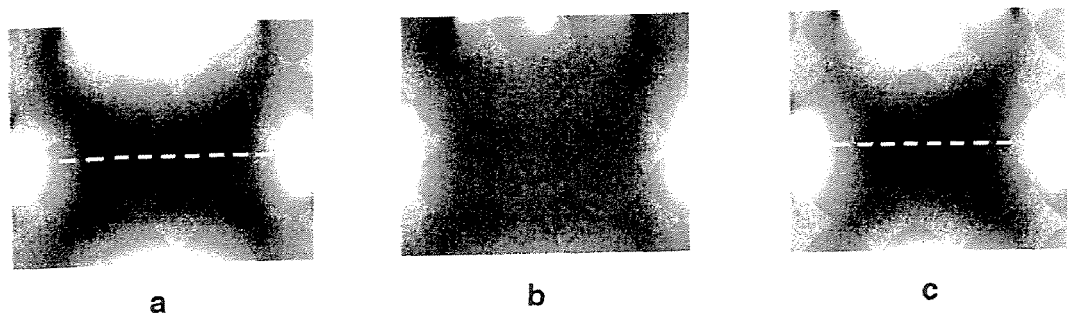
FIG. 15 shows simulated |B1| field maps for three coil element drive schemes.
Figure 16:
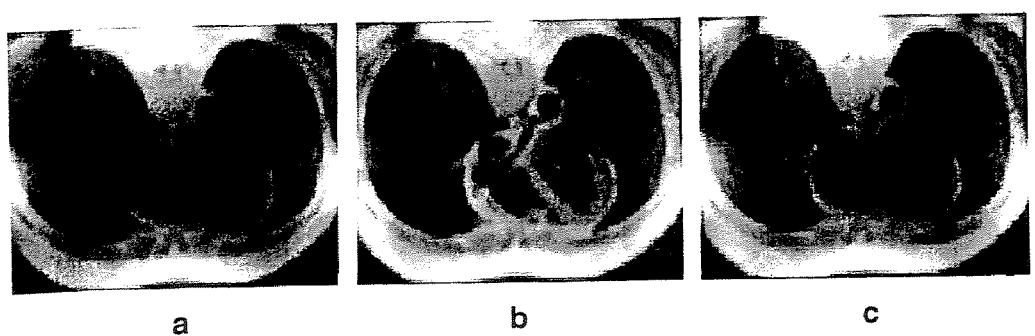
FIG. 16 shows simulated chest images for each of the drive schemes of FIG. 15.

FIG. 15 shows the transmitted |B1| field map inside the human torso model for each of the driving schemes listed in Table 3 using SENSE reconstruction. FIG. 16 shows the corresponding simulated chest images with the torso phased array coils used as a receiver coil to receive MR signal excited by the |B1| fields of FIG. 15.

Figure 17:
FIG. 17 is a SENSE reconstructed chest image.

From the simulations, the magnetic flux density with focused |B1| field is calculated for each coil element and used as the sensitivity profiles for the SENSE reconstruction. Using point-wise multiplication of the sensitivity profiles with the numerical chest images yields individual chest images. A reduction factor of 4 is employed for the simulation of SENSE reconstruction. Signal is separated from the aliased images using an unfolding matrix and SENSE reconstruction of the non-aliased chest image is shown in FIG. 17.

The simulation clearly shows that the focusing scheme delivers improved homogeneity across the targeted regions, as demonstrated early with the four-coil system. Furthermore, when used with a multi-scan process the focusing scheme produces improved field homogeneity across a target region and therefore improved SNR with reduced SAR.

Throughout the specification the aim has been to describe the invention without limiting the invention to any particular combination of alternate features.

The invention claimed is:

1. A magnetic resonance imaging apparatus comprising:
a magnet applying a magnetic field to a space;
a coil system surrounding the space, the coil system comprising:
a phased array having at least two coils;
means for driving each coil of the phased array at a first amplitude and phase determined to transmit a first magnetic field at a target region in the space; and
means for subsequently driving each coil of the phased array at a second amplitude and phase determined to transmit a second magnetic field to compliment the first magnetic field, wherein the second amplitude and phase is different from the first amplitude and phase; and
a magnetic resonance imaging system in communication with an interface subsystem of the coil system to receive a first response to the first magnetic field and a second response to the second magnetic field and to construct an image of the target region from the first response and the second response.

2. The magnetic resonance imaging apparatus of claim 1 wherein the phased array is a transceiver array which both transmits the field and receives the response.

3. The magnetic resonance imaging apparatus of claim 1 wherein the phased array comprises four coils.

4. The magnetic resonance imaging apparatus of claim 1 wherein the phased array comprises eight coils.

5. The magnetic resonance imaging apparatus of claim 1 wherein the means for driving comprises amplitude control means and phase control means.

6. The magnetic resonance imaging apparatus of claim 5 wherein the amplitude control means comprises a plurality of unequal power splitters.

7. The magnetic resonance imaging apparatus of claim 5 wherein the phase control means comprises a plurality of phase delay elements.

8. The magnetic resonance imaging apparatus of claim 1 wherein the interface subsystem comprises a plurality of switches.

9. The magnetic resonance imaging apparatus of claim 1 wherein the interface subsystem comprises a plurality of radiofrequency circulators.

10. The magnetic resonance imaging apparatus of claim 1 further comprising a database of first phase and amplitude values and second phase and amplitude values determined to be suitable for obtaining a magnetic resonance image of a patient based upon factors selected from: body region; age of patient; size of patient; and field strength.

11. The magnetic resonance imaging apparatus of claim 1 further comprising means for selecting the first amplitude, first phase, second amplitude and second phase.

12. A method of recording a magnetic resonance image of a target region including the steps of:
transmitting at least a first substantially uniform magnetic field into the target region by driving a phased array having at least two coils at a first set of selected phase and amplitude values;
recording signals received from the target region in response to the first substantially uniform magnetic field;
processing the signals to construct a first image;

subsequently transmitting at least a second substantially uniform magnetic field into the target region by driving a phased array at a second set of selected phase and amplitude values, wherein the second set of selected phase and amplitude values are different from the first set of selected phase and amplitude values;

recording signals received from the target region in response to the second substantially uniform magnetic field;

processing the signals to construct a second image; and constructing the magnetic resonance image of the target region from the first image and the second image.

13. The method of claim 12 wherein the step of transmitting includes the steps of:

driving the phased array with a first set of phase and amplitude values and recording signals to construct a first image;

driving the phased array with a second set of phase and amplitude values and recording signals to construct a second image; and constructing the image from said first image and said second image.

14. The method of claim 12 further including the steps of:

transmitting further substantially uniform magnetic fields into the target region by driving a phased array having at least two coils with a further set of selected phase and amplitude values; recording signals received from the target region in response to the further substantially uniform magnetic fields;

processing the signals to construct further images; and constructing the magnetic resonance image of the target region from the first image, the second image and the further images.

15. A method of recording a magnetic resonance image of a target region including the steps of:

transmitting a first magnetic field into said target region by driving a phased array having at least two coils with a first set of selected phase and amplitude values;

recording first signals received from the target region in response to the first magnetic field and constructing a first image from the first signals;

subsequently transmitting a second magnetic field into said target region by driving the phased array having at least two coils with a second set of selected phase and amplitude values, wherein the second set of selected phase and amplitude values are different from the first set of phase and amplitude values;

recording second signals received from the target region in response to the second magnetic field and constructing a second image from the second signals; and constructing the magnetic resonance image of the target region from the first signals and the second signals.

16. The method of claim 15 wherein the second set of selected phase and amplitude values are selected to compliment the first set of selected phase and amplitude values.

17. The method of claim 15 wherein the second set of selected phase and amplitude values are selected to reduce distortion due to the first set of selected phase and amplitude values.

18. The method of claim 15 wherein the first set of selected phase and amplitude values and the second set of selected phase and amplitude values are optimized with a phantom in the target region.

19. The method of claim 18 wherein the step of constructing the magnetic resonance image employs a process of averaging the first image and the second image.

20. The method of claim 19 wherein the process of averaging is point by point sum-of-squares averaging.

21. The method of claim 15 further including the steps of constructing a first image from the first signals, constructing a second image from the second signals and constructing the magnetic resonance image from the first image and the second image.

22. The method of claim 15 further including the steps of:

transmitting further magnetic fields into the target region by driving a phased array having at least two coils with a further set of selected phase and amplitude values;

recording further signals received from the target region in response to the further magnetic fields; and constructing the magnetic resonance image of the target region from the first signals, the second signals and the further signals.

23. The method of claim 18 wherein:

the step of transmitting a first magnetic field includes the steps of driving the phased array with a first set of phase and amplitude values and recording first time-domain signals;

the step of transmitting a first magnetic field includes the steps of driving the phased array with a second set of phase and amplitude values and recording second time-domain signals; and the step of constructing the magnetic resonance image includes combining the first time-domain signals and the second time-domain signals and performing a multi-dimensional Fourier transform to construct the image.

* * * * *